United States Patent [19]

Templin

[11] 4,274,892
[45] Jun. 23, 1981

[54] DOPANT DIFFUSION METHOD OF MAKING SEMICONDUCTOR PRODUCTS

[75] Inventor: Alan S. Templin, Manhattan Beach, Calif.

[73] Assignee: TRW Inc., Redondo Beach, Calif.

[21] Appl. No.: 969,322

[22] Filed: Dec. 14, 1978

[51] Int. Cl.³ .......................................... H01L 21/225
[52] U.S. Cl. .................................... 148/188; 148/1.5; 148/187
[58] Field of Search ................. 148/188, 175, 187, 1.5

[56] References Cited

U.S. PATENT DOCUMENTS

| | | | |
|---|---|---|---|
| 3,156,591 | 11/1964 | Hale et al. | 148/174 X |
| 3,502,517 | 3/1970 | Sussmann | 148/175 |
| 3,767,485 | 10/1973 | Sahagun | 29/583 X |
| 3,798,081 | 3/1974 | Beyer | 148/188 |
| 3,928,095 | 12/1975 | Harigaya et al. | 148/188 |
| 4,063,967 | 12/1977 | Graul et al. | 148/188 X |
| 4,063,973 | 12/1977 | Kirita et al. | 148/188 |
| 4,151,021 | 4/1979 | McElroy | 148/187 |

OTHER PUBLICATIONS

Kemlage et al., *I.B.M. Technical Disclosure Bulletin*, vol. 13, No. 4, Sep. 1970, p. 911.

*Primary Examiner*—G. Ozaki
*Attorney, Agent, or Firm*—John J. Connors; Donald R. Nyhagen

[57] ABSTRACT

Arsenic or other dopant selected from Group III or Group V of the Periodic Table of Elements is diffused into a silicon substrate to form a semiconductor product having a buried region, such as a buried layer or channel, by providing the substrate with a layer of polycrystalline silicon doped with the selected dopant and heating the substrate and layer in an oxygen environment at a temperature and for a period of time sufficient to oxidize all or substantially all the polycrystalline silicon and simultaneously diffuse the dopant into the substrate. The substrate comprises single crystal silicon or other silicon form whose oxidation rate is comparable to or less than the polycrystalline silicon to permit complete oxidation of the polycrystalline silicon without excessive oxidation of the substrate.

4 Claims, 8 Drawing Figures

DEPOSIT POLYSILICON LAYER

APPLY PHOTORESIST

PATTERN PHOTORESIST

ETCH POLYSILICON

REMOVE PHOTORESIST

OXIDIZE & DIFFUSE

DOPANT DIFFUSION METHOD OF MAKING SEMICONDUCTOR PRODUCTS

BACKGROUND OF THE INVENTION

One of the basic steps in the fabrication of a wide variety of semiconductor microelectronic devices involves doping of silicon with an impurity, commonly referred to as a dopant, to produce in the silicon a region, such as a buried layer or channel, of desired semiconductor type, i.e. n-type or p-type. An n-type silicon is one in which the majority charge carriers are electrons and is produced by doping with an n-type silicon dopant of the donor species selected from Group V of the Periodic Table of Elements. A p-type silicon is one in which the majority carriers are holes and is produced by doping with a p-type dopant of the acceptor species selected from Group III of the Periodic Table of Elements. By way of example, one type of semiconductor microelectronic device whose fabrication involves doping of silicon is an NPN transistor having a doped region of low resistivity silicon in a silicon substrate buried under a layer of epitaxial silicon. This buried region is called a buried layer and is produced by diffusing the dopant into the silicon substrate to form in the substrate a region, referred to herein as a buried region, which is diffused with the dopant and constitutes the buried layer. Other buried dopant diffused regions are called buried channels. In the context of this invention the expression "buried region" is intended to cover, in a generic sense, all diffused dopant regions in a silicon substrate produced by diffusing a dopant into the substrate.

At the present time, antimony is used as the dopant for the buried layers of NPN transistors. The reasons for selecting antimony as the dopant are twofold; namely, the low diffusion coefficient of antimony in silicon and the capability of diffusing antimony by a gaseous process to a relatively high (0.005$\Omega$-CM) dopant level. The use of antimony as a dopant for buried layers, however, does present certain problems. For example, antimony for use as a dopant is derived from $SbO_3$ by decomposing the latter in a source furnace at ~900° C. This source furnace requires substantial maintenance, is subject to failure, and necessitates the use of a special diffusion tube. Moreover, antimony diffusion requires a thick (~18,000 Å) oxide layer to mask the diffusion. Growing this thick oxide layer creates more crystal defects than a thin oxide layer. The thick oxide layer also degrades photoresist etching resolution due to the long etch times required to remove the thick oxide. Another problem resides in the fact that the antimony diffusion junction depth and sheet resistance have poor repeatability run to run. Finally, gaseous antimony diffusion requires an oxide mask on the back of the substrate, thus complicating buried layer photoresist procedures.

Arsenic also has a high solubility limit and a low diffusion coefficient in silicon and does not present any of the antimony diffusion problems discussed above. Based on the foregoing factors, therefore, arsenic is an excellent buried layer dopant for silicon. Unfortunately, however, the vapor pressure of arsenic into silicon is too low to achieve a satisfactory dopant level on the order of 0.005$\Omega$CM using an open tube diffusion procedure. While such a dopant level can be attained by use of a closed tube diffusion procedure, the existing closed tube procedures are very complicated and hence costly and time consuming to practice. It is also possible to employ a spin-on arsenic dopant source in an open tube diffusion procedure. Such spin-on sources, however, require special handling, involve operator exposure to arsenic, are sensitive to humidity, have limited shelf life even when stored under refrigeration, and produce non-uniform diffusions in oxide mask windows. Silicon doping has also been accomplished by providing a doped layer of polycrystalline silicon on a silicon substrate and heating the layer and substrate to diffuse the dopant into the substrate. In this procedure, no attempt was made to oxidize the polysilicon from the substrate during diffusion. In this regard, it is significant to note that total removal of the polysilicon is necessary if an epitaxial layer is to be grown over the buried region.

SUMMARY OF THE INVENTION

According to one of its aspects, this invention provides an improved method for diffusing arsenic into a silicon substrate so as to permit the utilization of arsenic as a buried region dopant with its attendant advantages over antimony without any of the arsenic diffusion problems discussed above. According to this arsenic diffusion method, a silicon substrate is provided having a layer of polycrystalline silicon doped with arsenic. This arsenic-doped layer may be formed either by depositing arsenic-doped polycrystalline silicon on the substrate or by depositing arsenic-free polycrystalline silicon on the substrate and then introducing the arsenic into the arsenic-free polycrystalline silicon, as by ion implantation.

The silicon substrate and its layer of arsenic-doped polycrystalline silicon are then heated in an oxygen environment at a temperature and for a period of time sufficient to oxidize all or substantially all the polycrystalline silicon from the substrate. This oxidation of the polycrystalline silicon occurs from the outer surface of the layer inwardly toward the substrate and forms an oxide layer which increases in thickness as the polycrystalline silicon is consumed. The arsenic dopant in the layer is released as the oxidation proceeds inwardly and, being trapped or confined between the oxide layer and silicon substrate, diffuses into the substrate to form a buried arsenic-doped region in the substrate.

According to the preferred practice of the invention, the substrate and its arsenic-doped polycrystalline silicon layer is heated in the presence of excess oxygen and at a temperature and for a period of time to over-oxidize and thereby consume by oxidation all the polycrystalline silicon in the layer. The substrate comprises single crystal silicon or other silicon form having an oxidation rate comparable to or less than the polycrystalline silicon to permit oxidation of all the polycrystalline silicon from the substrate without excessive consumption of the substrate by oxidation when necessary, for example, to enable growing of an epitaxial layer over the buried region.

In most actual applications of the invention, of course, the arsenic-doped buried region which is formed by the practice of the invention will be patterned in accordance with the desired function(s) of the completed semiconductor device embodying the region. This patterning of the region may be accomplished by forming an unpatterned arsenic-doped layer on the substrate and then patterning this layer, as by masking and etching, in accordance with the desired buried region pattern. Alternatively, an oxide layer may be first deposited on the substrate and then masked and etched to form a window pattern corresponding to the desired pattern of the buried dopant region after which the arsenic-doped polysilicon layer may be formed over the oxide and then oxidized as before.

The invention is particularly suited to arsenic doping of a silicon substrate to form an arsenic-doped buried region in the substrate and avoid the problems associated with the use of antimony as a dopant as well as those involved in the prior arsenic doping procedures. The invention, however, is not limited to the use of arsenic as the dopant and may be practiced with any dopant selected from Group III or Group V of the Periodic Table of Elements.

DESCRIPTION OF THE PREFERRED EMBODIMENT OF THE INVENTION

Figure 1:
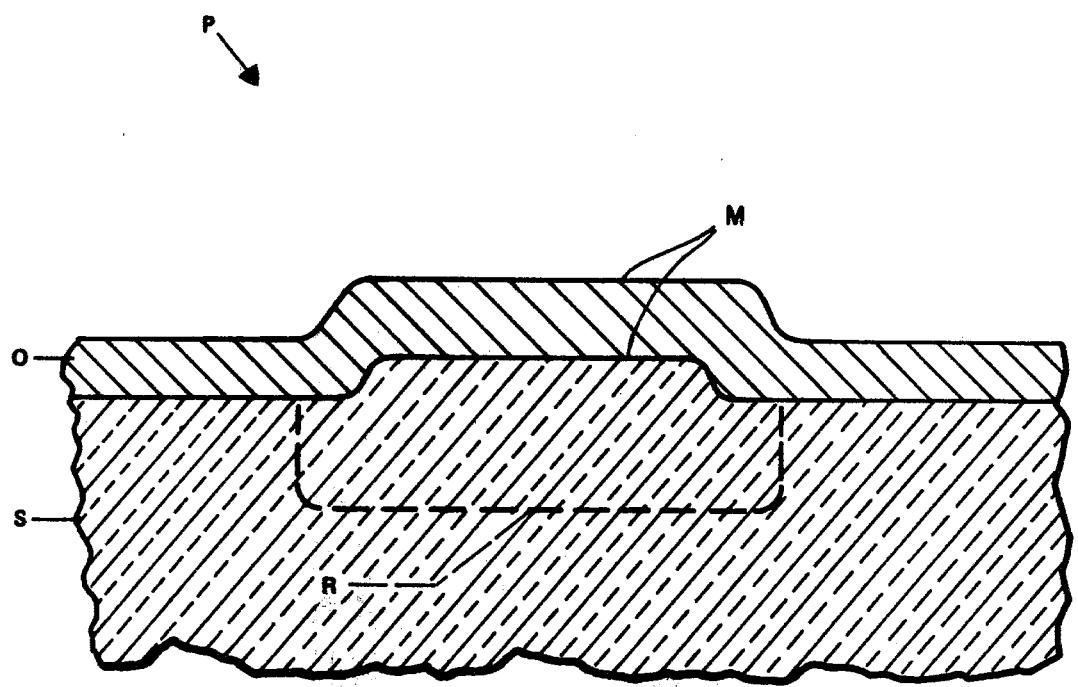
FIG. 1 is an enlarged fragmentary section through a semiconductor product having a buried region produced in accordance with this invention.

Turning to these drawings and first to FIG. 1, there is illustrated a simple silicon semiconductor microelectronic product P according to the invention. This semiconductor product has a silicon substrate S containing a patterned buried region R, such as a buried layer or channel, produced by the present dopant diffusion method. The method yields a silicon oxide layer O which overlies and covers the buried region R and may or may not be removed depending upon the end use of the product and an upstanding mesa structure M over and locationally marking the buried region. This region is diffused with a dopant selected from Group III or Group V of the Periodic Table of Elements. As noted earlier, this invention is primarily concerned with diffusing arsenic into a silicon substrate and will be described in this context. Accordingly, in the following description, the selected dopant will be assumed to be arsenic.

Briefly, according to the present method of making the silicon semiconductor product P, a silicon substrate 10 is provided (FIG. 2) having a polycrystalline silicon layer 12 doped with the selected dopant, i.e. arsenic. Substrate 10 is typically a silicon wafer of the kind used in the fabrication of semiconductor microelectronic devices or chips.

Figure 4:
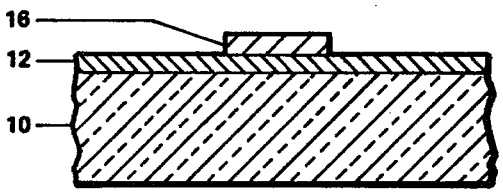
Figure 5:
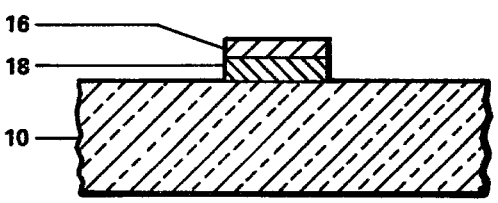
Figure 6:
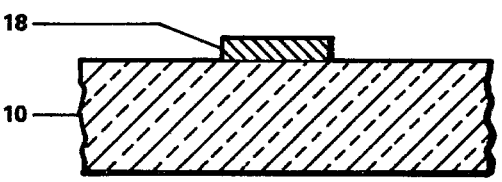

Polycrystalline layer 12 is patterned in accordance with the desired buried region pattern in the finished semiconductor product P, as indicated in FIGS. 4-6 to form a patterned doped polycrystalline layer 18 surrounded by and rising above a bare surface portion of the substrate.

Figure 7:
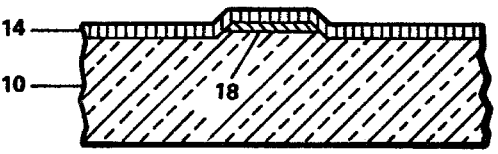
Figure 8:
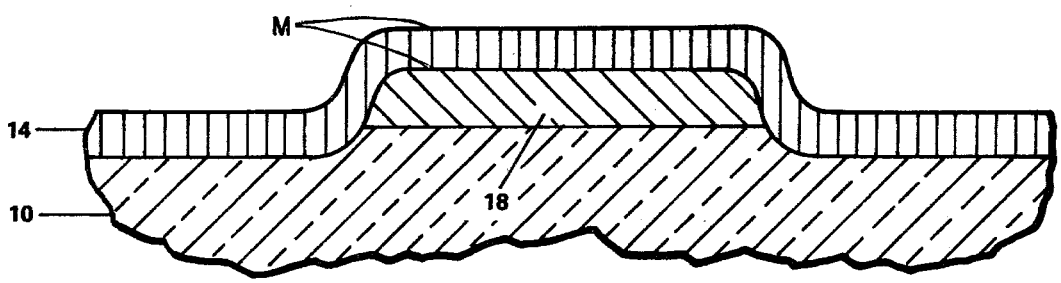
FIG. 8 is a fragmentary enlargement of FIG. 7.

The next step (FIG. 7) of the present arsenic diffusion process involves heating the substrate 10 and the arsenic-doped layer 12 in an oxygen environment at a temperature and for a period of time sufficient to oxidize all or substantially all of the polycrystalline silicon in the layer. During this oxidation process, the polysilicon layer 12 oxidizes progressively from its outer surface toward the substrate 10, and the substrate also oxidizes, which results in the growth of the oxide layer O in the finished semiconductor product P. In FIG. 7, this growing oxide layer on the oxidizing arsenic-doped polysilicon layer 12 is designated by the reference numeral 14.

During this oxidation of the polysilicon layer 12, the arsenic dopant in the layer is released, and being trapped between the substrate 10 and the growing oxide layer 14, diffuses into the substrate to form the buried region R in the finished semiconductor product P.

Referring now in more detail to the present arsenic diffusion process, the arsenic-doped polycrystalline silicon layer 12 may be formed in two different ways. Also, this layer may be patterned in two different ways to provide a patterned arsenic-doped polysilicon layer corresponding to the desired buried region pattern in the finished semiconductor product P.

Referring first to the formation of the arsenic-doped polysilicon layer 12 itself, this layer may be produced by depositing polycrystalline silicon on the substrate 10 in the presence of arsenic, such that the arsenic diffuses into or is otherwise introduced into the polycrystalline silicon during its deposition on the substrate. In this procedure, therefore, the layer 12 is formed, effectively, by depositing arsenic-doped polycrystalline silicon on the substrate 10. An alternative method of forming the layer 12 is to deposit arsenic-free polycrystalline silicon on the substrate and thereafter introduce the arsenic dopant into the arsenic-free polysilicon layer by ion implantation or in any other suitable way. These procedures for forming an arsenic-doped layer on a silicon substrate are well-known in the art and the details of such procedures form no part of the invention. Accordingly, no further description of the arsenic-doped layer forming method is deemed necessary. Suffice it to say that the thickness of the arsenic doped polysilicon layer 12 and its dopant concentration will depend upon the desired depth of a dopant concentration in the buried region R to be produced, as will appear from the examples hereafter set forth.

Figure 2:
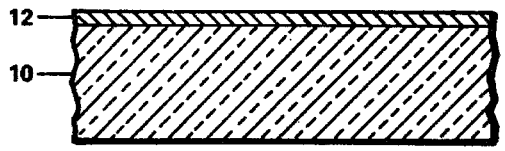
FIGS. 2-7 depict the successive steps in making the semiconductor product of FIG. 1.
Figure 3:
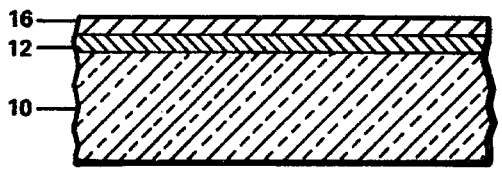

As noted earlier, the arsenic-doped polysilicon layer 12 may be patterned in two different ways, the preferred patterning procedure being illustrated in the drawings. In this preferred patterning procedure, an unpatterned arsenic-doped polysilicon layer 12 is applied to the entire surface, or at least an extensive surface area, of the substrate, as shown in FIG. 2. A patterned photoresist layer or mask 16 is then formed on the polysilicon layer 12, as shown in FIGS. 3 and 4. This photoresist mask 16 is patterned in accordance with the desired buried region pattern in the finished semiconductor product P. Thereafter, the arsenic-doped polysilicon layer 12 is subjected to a chemical silicon etch which removes the doped polysilicon except where it is protected by the mask 16, as shown in FIG. 5. After etching, the photoresist mask 16 is removed, leaving the patterned arsenic-doped polysilicon layer 18 shown in FIG. 6. The procedures for forming the photoresist mask 16, etching the masked, arsenic-doped polysilicon layer 12, and removing the mask to form the patterned arsenic-doped polysilicon layer 18 are conventional and well-known and hence need not be explained further in this disclosure.

According to the alternative procedure of forming the patterned arsenic-doped polycrystalline silicon layer 18, a thin oxide layer is initially formed over the entire substrate 10. A patterned photoresist mask, having a window conforming to the desired buried region pattern in the finished semiconductor product P, is then formed on the oxide layer and this layer is etched through the window and the photoresist mask is removed, leaving on the substrate 10 an oxide mask having a window conforming to the desired buried region pattern. The arsenic-doped polysilicon layer 12 is then formed over this oxide mask, after which the substrate is oxidized and diffused to form the buried region as explained below. In this case, the oxide layer serves as a diffusion mask.

As noted earlier, the next step in the present arsenic diffusion procedure involves oxidation of the patterned arsenic-doped polycrystalline layer 18 by heating of this layer and the substrate 10 in an oxygen environment, as indicated in FIG. 7. During this step, the substrate and layer are heated at a temperature and for a period of time sufficient to oxidize all or substantially all the polycrystalline silicon in the layer 18. In this regard, it will be recalled from the earlier discussion that if an epitaxial layer is to be grown over the diffused region, all of the polysilicon must be oxidized. Such total oxidation of the polysilicon can be accomplished by oxidation of the substrate and polysilicon layer in the presence of excess oxygen, that is more oxygen than required to oxidize all the polycrystalline silicon in the layer 18, whereby the latter silicon is effectively over-oxidized. In other words, if the particular semiconductor application at hand requires complete oxidation of the polysilicon, it is the preferred practice of the invention to over-oxidize the polysilicon layer.

As shown in FIG. 6, during this oxidation step, the doped polysilicon layer 18 oxidizes from its outer surface toward the substrate 10 and the bare substrate surface about the doped layer oxidizes to form the growing oxide layer 14 and the mesa structure M. This oxidation of the polycrystalline silicon in the layer 18 releases the arsenic with which the polysilicon is doped. The released arsenic, in turn, being trapped between the growing oxide layer 14 and the substrate 10, diffuses into the substrate to form the patterned buried region R (FIG. 1) in the substrate. This oxidation step is continued until the oxidation process consumes all the polysilicon in the layer 18 to form the finished semiconductor product P of FIG. 1.

As just mentioned, and illustrated in FIG. 7, during the described oxidation step of the present arsenic diffusion process, the substrate 10 also oxidizes to form the mesa structure M. In order to avoid excessive oxidation of the substrate, without the necessity of masking the substrate against oxidation, the substrate may comprise a silicon form whose oxidation rate, at least when heated in the presence of oxygen in accordance with this invention, is comparable to or slower than that of the arsenic-doped polycrystalline silicon in the layer 18. For example, the substrate may comprise single crystal silicon whose oxidation rate at temperatures on the order of 1000° C. or less is on the order of one fourth of that of relatively heavily doped polycrystalline silicon. This use of a silicon substrate with a relatively slow oxidation rate permits total oxidation and hence total removal of the polysilicon from the substrate by over-oxidation, as explained above, without excessive consumption of the substrate by oxidation. In the case of a single crystal silicon substrate, for example, a 2000 Å layer of heavily arsenic-doped polycrystalline silicon can be oxidized off the substrate by 100% over-oxidation of the polysilicon to assure total removal of the polysilicon from the substrate while consuming by oxidation only 500 Å of the single crystal substrate. Since oxidation does not tend to deplete n-type silicon of its dopant and the diffusion resulting from 2000 Å of doped polycrystalline silicon reaches a depth of 45,000 Å, the 500 Å of single crystal silicon consumed or removed from the substrate has no measurable effect on junction depth or sheet resistance.

The present arsenic-diffusion process has several advantages over the existing antimony diffusion process and arsenic diffusion processes discussed at the outset. Among the foremost of these advantages are the following:

1. The polycrystal silicon used as the arsenic dopant source is removed from the substrate by oxidation which permits complete removal of the polysilicon without the use of a chemical silicon etch that would attack the single crystal substrate.

2. A relatively thin (5000 Å) oxide mask can be used for buried layer diffusion when using the alternative patterning procedure discussed earlier.

3. The back of the silicon substrate or wafer does not need to be protected by oxide, as no doped polysilicon is deposited on the back.

4. The polysilicon doping level is maintained by control of gasses during polysilicon growth or by ion implantation and not by the amount of $SbO_3$ in a source furnace, or source furnace temperature, whereby more controllable diffusion is attained.

5. No source furnace or special diffusion tube is needed.

6. The amount of doping produced in the buried region or layer is a non-critical function of the arsenic content of the doped polysilicon, thereby making diffusions easy to control and reproduce.

While the invention is intended primarily for use with arsenic as the dopant, it will now be obvious that the invention may also be used to diffuse other dopants selected from Group III or Group V of the Periodic Table of Element.

Set forth below is an actual example of the present arsenic diffusion procedure carried out with a substrate in the form of a 2¼ inch single crystal silicon wafer 25Ω-CM p-type approximately 10 mils thick. This procedure produced a buried layer with the following characteristics:

Buried layer thickness: ~4.5 μm
Sheet resistance: ~5 ohms per square
Oxide thickness: ~5000 Å

EXAMPLE

A. Clean substrate by:
 1. 15 second immersion in buffered oxide etch
 2. 5 minute rinse in flowing, bubbling DI distilled water,
 3. 5 minute immersion in 7 parts sulfuric acid and, 3 parts hydrogen peroxide at 90° C.,
 4. 5 minute immersion in nitric acid at 90° C.,
 5. 5 minute rinse in flowing, bubbling hot DI water,
 6. 2 minute ultrasonic cleaning immersion in 5 parts, hydrogen peroxide to one part ammonium hydroxide,
 7. 5 second immersion in buffered oxide etch,
 8. 1 minute rinse in DI water,
 9. Spin dry,
 10. Scrub wafers with DI water.
B. Deposit polysilicon layer ~2000 Å thick on substrate by chemical vapor deposition in deposition ambient consisting of arsine, silane and hydrogen.
C. Clean substrate by:
 1. 15 minute immersion in a boiling mixture of 1 part hydrogen peroxide and one part ammonium hydroxide.
 2. 30 minute rinse in flowing DI water.

D. Deposit photoresist and develop desired pattern.
E. Etch polysilicon to form desired pattern.
F. Clean substrate by:
  1. 5 minute immersion in hot (150° C.) sulfuric acid,
  2. 1 minute rinse in flowing DI water,
  3. Repeat steps 1 and 2 two more times,
  4. 5 minute immersion in hot nitric acid,
  5. 1 minute rinse in flowing DI water,
  6. 3 second immersion in buffered oxide etch,
  7. 15 minute immersion in a boiling mixture of 1 part hydrogen peroxide and one part ammonium hydroxide,
  8. 30 minute rinse in flowing DI water.
G. Diffuse and oxidize by heating substrate and arsenic doped polysilicon layer at 1220° C. for 3 hours; in a dry oxygen ambient.

I claim:

1. The method of making a silicon semiconductor product having a patterned doped region, comprising the steps of:
    forming on an unmasked surface of a silicon substrate a patterned layer of polycrystalline silicon doped with a dopant selected from Group III or Group V of the Periodic Table of Elements and surrounded by and rising above a bare surface portion of said substrate; and
    heating said substrate and layer in an oxygen environment at a temperature and for a period of time sufficient to concurrently oxidize substantially all the polycrystalline silicon in said layer, diffuse said dopant into said substrate, and consume by oxidation said bare surrounding substrate surface portion, thereby forming a patterned upstanding mesa structure on said substrate and a correspondingly patterned buried doped region below and locationally marked by said mesa structure.

2. The method of claim 1 wherein said patterned polycrystalline silicon layer is formed by:
    depositing a layer of polycrystalline silicon on said unmasked substrate surface and then removing portions of said latter layer.

3. The method of claim 2 wherein:
    said substrate comprises a form of silicon having an oxidation rate approximating or substantially slower than the oxidation rate of said polycrystalline silicon when said substrate and layer are heated in said oxygen environment whereby said polycrystalline silicon can be substantially totally oxidized without excessive oxidation of said substrate.

4. The method of claim 2 wherein:
    said substrate is a single crystal silicon substrate whose oxidation rate is comparable to or substantially slower than the oxidation rate of said polycrystalline silicon when said substrate and layer are heated in said oxygen environment, whereby said polycrystalline silicon can be substantially totally oxidized without excessive oxidation of said substrate.

* * * * *